United States Patent [19]
Yamamoto

[11] Patent Number: 5,633,783
[45] Date of Patent: May 27, 1997

[54] MULTI-CHIP CERAMIC MODULE FOR MOUNTING ELECTRIC PARTS ON BOTH SUBSTRATE AND CAP CONNECTED THROUGH INTERCONNECTING PINS

[75] Inventor: Takesi Yamamoto, Kumamoto, Japan

[73] Assignee: Fujitsu Limited, Kanagawa, Japan

[21] Appl. No.: 537,248

[22] Filed: Sep. 29, 1995

[30] Foreign Application Priority Data

Sep. 29, 1994 [JP] Japan ................................ 6-235149

[51] Int. Cl.⁶ .................................................. H05K 7/20
[52] U.S. Cl. ...................... 361/704; 257/686; 257/700; 257/713; 257/723; 361/715; 361/744; 361/774; 361/791
[58] Field of Search ............................ 257/685–686, 257/690, 693, 697, 700, 704, 706–707, 712–713, 723–724, 738; 361/704, 707, 714–722, 744, 760–764, 772, 774, 790–791, 803, 820; 437/209, 210; 439/68–69, 72, 74, 75, 83

[56] References Cited

U.S. PATENT DOCUMENTS

| | | | |
|---|---|---|---|
| 4,724,472 | 2/1988 | Susimoto et al. | 257/686 |
| 5,043,794 | 8/1991 | Tai et al. | 257/686 |
| 5,199,164 | 4/1993 | Kim et al. | 257/712 |
| 5,444,296 | 8/1995 | Kaal et al. | 257/686 |

FOREIGN PATENT DOCUMENTS

| | | | |
|---|---|---|---|
| 1308057 | 6/1988 | Japan . | |
| 4177870 | 6/1992 | Japan | 257/697 |

*Primary Examiner*—Gregory D. Thompson

[57] ABSTRACT

Multi-layer wiring structures are respectively formed in upper and lower ceramic substrates for electric parts, and interconnecting pins held in contact with contact pads establish electrical connections between the multi-layer wiring structures so as to prevent a multi-chip module from an undesirable disconnection between the multi-layer wiring structures.

7 Claims, 7 Drawing Sheets

MULTI-CHIP CERAMIC MODULE FOR MOUNTING ELECTRIC PARTS ON BOTH SUBSTRATE AND CAP CONNECTED THROUGH INTERCONNECTING PINS

FIELD OF THE INVENTION

This invention relates to a multi-chip ceramic module and, more particularly, to a multi-chip ceramic module for mounting electric parts on both ceramic substrate and cap plate.

DESCRIPTION OF THE RELATED ART

A typical example of the multi-chip ceramic module is illustrated in FIG. 1 of the drawings. The prior art multi-chip ceramic module comprises a multi-layer ceramic substrate 1, electric parts 2a, 2b and 2c mounted on the multi-layer ceramic substrate 1 and a metallic radiator plate 3. Though not shown in FIG. 1, wirings patterns are formed on the ceramic plates 1a of the multi-layer ceramic substrate 1, and center apertures are respectively formed in the ceramic plates 1a, and are enlarged from the uppermost ceramic plate to the lowermost ceramic plate. The apertures form in combination a center recess 1b, and the inner edges of the ceramic plates 1a are exposed to the center recess 1b. Bonding pads 1c are provided on the exposed inner edges of the ceramic plates 1a, and are electrically connected to the wiring patterns. Contact pads 1d are further formed on the upper surface of the multi-layer ceramic substrate 1, and are also electrically connected directly or through holes to the wiring patterns. One of the electric parts 2a such as a semiconductor integrated circuit device is soldered to the metallic radiator plate 3, and is accommodated in the center recess 1b. The semiconductor integrated circuit device 2a is connected through bonding wires 1e to the bonding pads 1c, respectively. The other electric parts 2b and 2c are mounted on the upper surface of the multi-layer ceramic substrate 1, and are bonded to the contact pads 1d.

The prior art multi-chip ceramic module further comprises a plurality of input-and-output pins 4 for communicating with external modules. The plurality of input-and-output pins 4 are electrically connected to the wiring patterns, and downwardly project from the multi-layer ceramic substrate 1.

The prior art multi-chip ceramic module further comprises a heat sink 5 bonded to the metallic radiator plate 3 and a metal cap 6 attached to the lower surface of the multi-layer ceramic substrate 1. While the semiconductor integrated circuit device 2a operates in cooperation with the other electric parts 2b and 2c, the semiconductor integrated circuit device 2a generates heat, and the heat is transferred through the metallic radiator plate 3 to the heat sink 5. Thus, the heat sink 5 prevents the semiconductor integrated circuit device 2a from overheat. Moreover, the metallic radiator plate 3 forms a gap between the upper surface of the multi-layer ceramic substrate 1 and the heat sink 5 for the electric parts 2b and 2c. The metal cap 6 closes the center recess 1b, and prevents the semiconductor integrated circuit device 2a from undesirable physical impact and contamination.

The prior art multi-chip ceramic module thus arranged encounters a problem in the time-consuming assembling work. Namely, the semiconductor integrated circuit device is connected to the metallic radiator plate 3 by using a die-bonding technique, and, thereafter, the bonding pads 1c are connected through the bonding wires 1e to the electrodes of the semiconductor integrated circuit device 2a. Subsequently, the metal cap 6 is fixed to the multi-layer ceramic substrate 1, and the other electric parts 2b and 2c are fixed to the contact pads 1d. Finally, the heat sink 5 is bonded to the metallic radiator plate 3. Thus, the prior art multi-chip ceramic module is assembled by the five steps, and the step-wise assembling steps make the assembling work time-consuming. Especially, the electric parts 2b and 2c are assembled after the sealing stage with the metal cap 6, and the assembling works on the electric parts 2a, 2b and 2c can not be executed in parallel.

Another problem inherent in the prior art multi-chip ceramic module is its heat radiation capability. Namely, the electric parts 2b and 2c occupy a substantially large area on the upper surface of the multi-layer ceramic substrate 1, and the metallic radiator plate 3 can not be enlarged.

Yet another problem inherent in the prior art multi-chip ceramic module is that a small amount of area is available for the input-and-output pins 4. This is because that the central area is used for the recess 1b accommodating the semiconductor integrated circuit device 2a. Only the peripheral area of the multi-layer ceramic substrate 1 is available for the input-and-output pins 4, and a full grid array can not be realized. For this reason, the prior art multi-chip ceramic module is not suitable for a complicated electric system requesting a large number of the input-and-output pins.

Another example of the multi-chip ceramic module which is disclosed in Japanese Patent Publication of Unexamined Application No. 1-308057, is free from the problems inherent in the first prior art multi-chip ceramic module. FIG. 2 illustrates the prior art multi-chip ceramic module disclosed in the Japanese Patent Publication of Unexamined Application.

The prior art multi-chip ceramic module comprises a multi-layer ceramic substrate 11, a ceramic substrate 12 laminated on the multi-layer ceramic substrate 11 and semiconductor chips 13. A plurality of wide recesses 12a are formed in the ceramic substrate 12, which are open to the multi-layer ceramic substrate 11. Narrow recesses 12b are further formed in the ceramic substrate 12, which are open to the wide recesses 12a. Therefore, steps are formed between the wide recesses 12a and the narrow recesses 12b, and bonding pads 14a are formed on the steps. The semiconductor chips 13 are electrically connected to the bonding pads 14a through bonding wires (not shown). Vertical connections 14b respectively pass through viaholes formed in the ceramic substrate 12, and connect the bonding pads 14a to contact pads 14c (see FIG. 3).

On the other hand, a multi-level wiring pattern 14d is formed in the multi-layer ceramic substrate 11, which multi-level wiring pattern 14d is connected at the upper end to contact pads 14e and at the lower end to input-and-output pins 14f. The contact pads 14c are fixed through solder bumps 14g to the contact pads 14e. Thus, the bonding pads 14a, the vertical connections 14b, the contact pads 14c, the solder bumps 14g, the contact pads 14e and the multi-level wiring pattern 14d selectively connect the semiconductor chips 13 to the input-and-output pins 14f.

The semiconductor chips 13 are concurrently fixed to the bonding pads 14a by using the wire bonding technique, and there is no problem even if a heat sink covers the entire upper surface of the ceramic substrate 12. On the other hand, the entire lower surface of the multi-layer ceramic substrate 11 is available for the input-and-output pins 14f, and a grid array may be formed thereon. However, the electrical connections between the ceramic substrates 11 and 12 are realized by using the solder bumps 14g, and disconnections are liable to take place between the contact pads 14c and the corresponding contact pads 14e due to warping of the ceramic substrate 11 or 12 or the solder bumps 14g below the standard.

SUMMARY OF THE INVENTION

It is therefore an important object of the present invention to provide a multi-chip module in which disconnections are avoided.

To accomplish the object, in the present invention proposes to mount electric parts are mounted on a multi-layer ceramic cap plate.

In accordance with the present invention, there is provided a multi-chip module comprising a first insulating substrate having a first surface, a second surface reverse to the first surface and an inner surface forming a hollow space open to the second surface, the hollow space having a first hollow sub-space open to the second surface and a second hollow sub-space narrower than the first hollow sub-space and contiguous to a central area of the first hollow sub-space; a second insulating substrate having a third surface and a fourth surface reverse to the third surface and connected to the second surface so as to close the hollow space therebetween; a first wiring means formed in the first insulating substrate and having portions exposed to the second surface and partially to the inner surface; a second wiring means formed in the second insulating substrate and having portions exposed to the third surface and partially to the fourth surface; at least one first electric part accommodated in the second hollow sub-space and electrically connected to the first wiring means exposed to the inner surface; a plurality of input-and-output means provided on the fourth surface and connected to the second wiring means exposed to the fourth surface; a plurality of conductive connecting means connected between the first wiring means exposed to the second surface and the second wiring means exposed to the third surface; and at least one second electric part mounted on the third surface and connected to the second wiring means exposed to the third surface.

BRIEF DESCRIPTION OF THE DRAWINGS

The features and advantages of the multi-chip ceramic module according to the present invention will be more clearly understood from the following description taken in conjunction with the accompanying drawings in which.

DESCRIPTION OF THE PREFERRED EMBODIMENTS

First Embodiment

Figure 1:
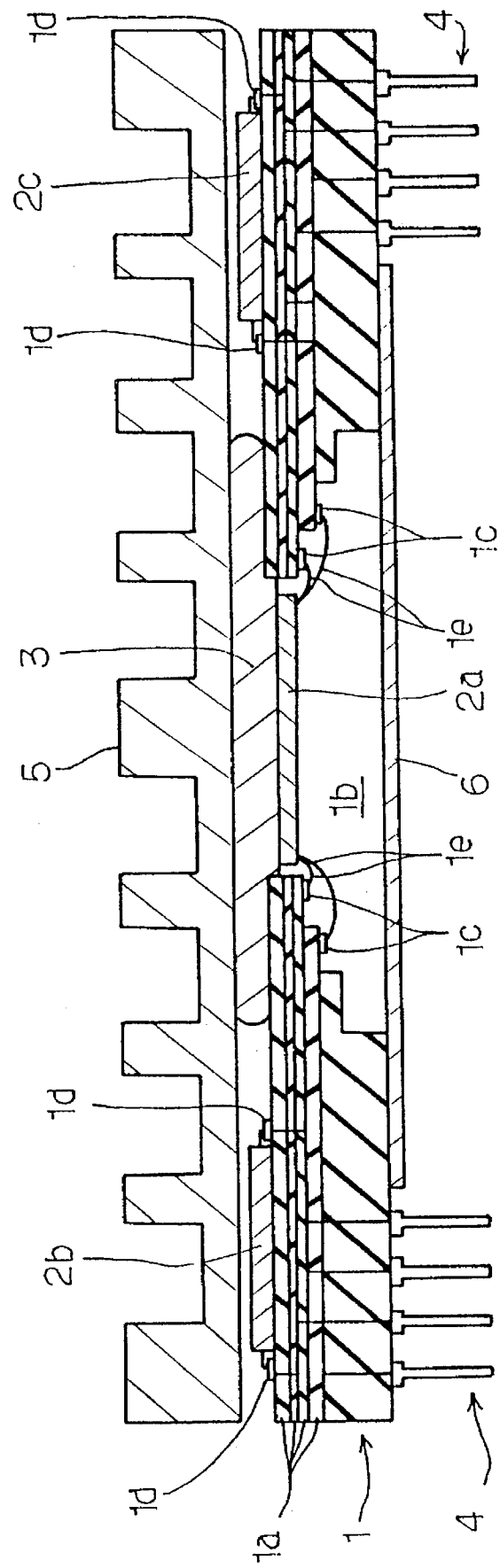
FIG. 1 is a cross sectional view showing the structure of the prior art multi-chip ceramic module.
Figure 2:
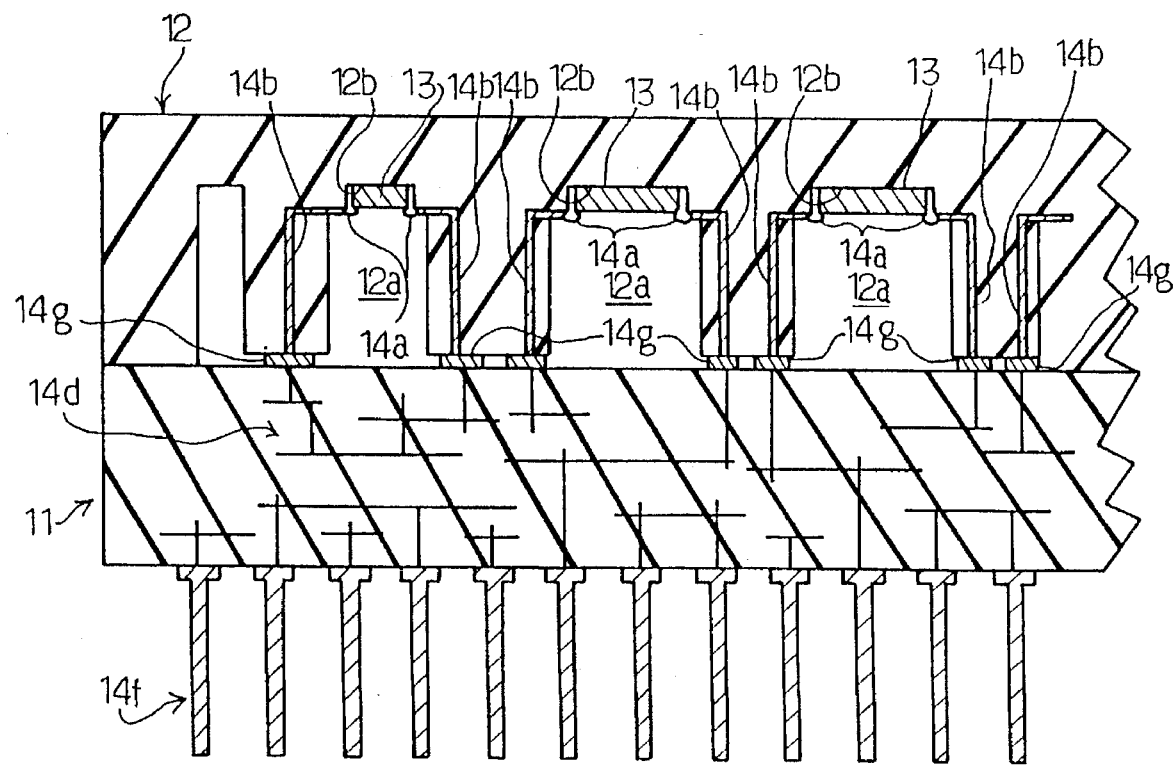
FIG. 2 is a cross sectional view showing the structure of the prior art multi-chip ceramic module disclosed in the Japanese Patent Publication of Unexamined Application.
Figure 3:
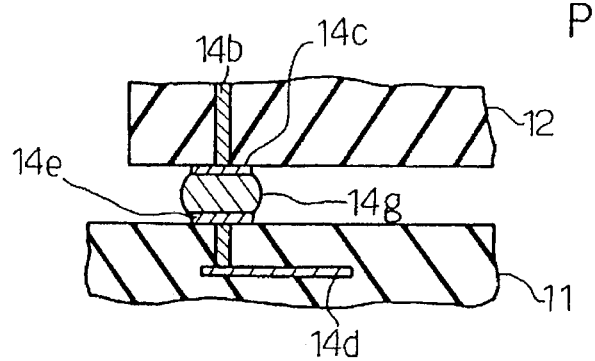
FIG. 3 is a side view showing the solder bump incorporated in the prior art multi-chip ceramic module.
Figure 4:
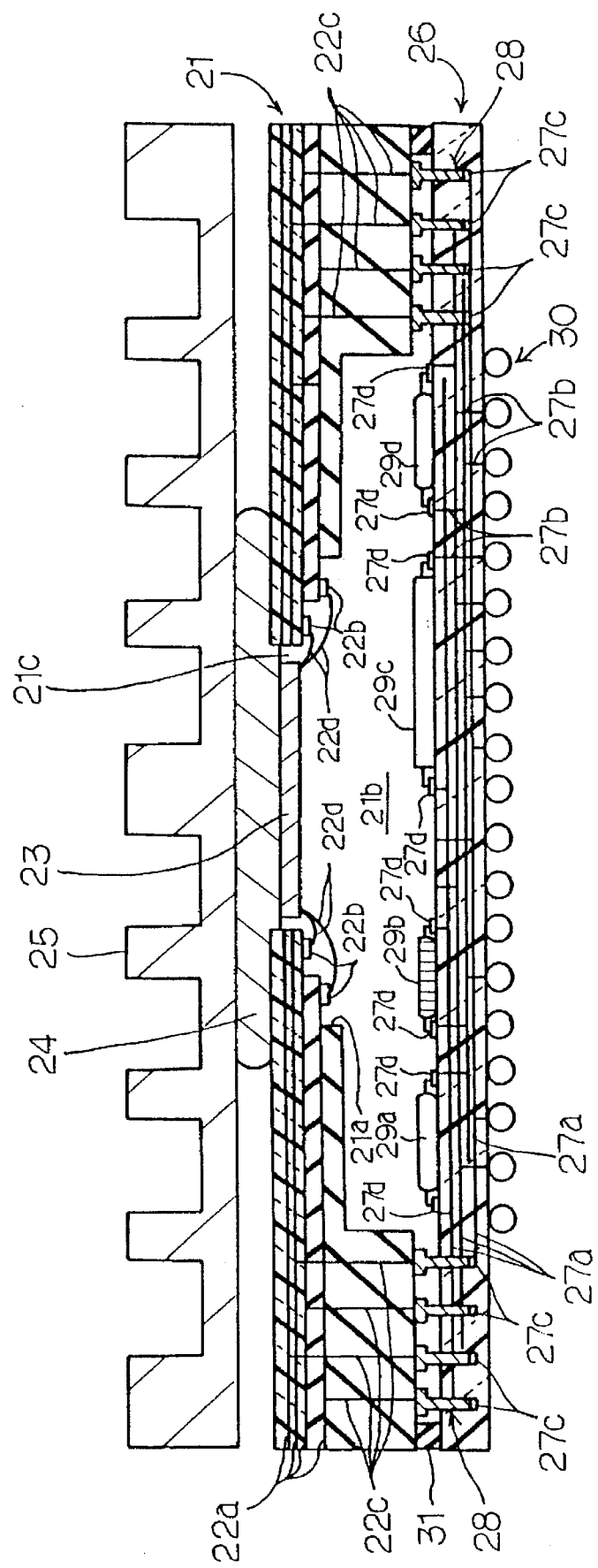
FIG. 4 is a cross sectional view showing the structure of a multi-chip ceramic module according to the present invention.

Referring to FIG. 4 of the drawings, a multi-chip ceramic module embodying the present invention comprises a first ceramic substrate 21, a multi-layer wiring 22a formed in the first ceramic substrate 21 and partially exposed to an inner surface 21a of the first ceramic substrate 21, a plurality of bonding pads 22b formed on the inner surface 21a and vertical connections 22c exposed to a lower surface of the first ceramic substrate 21. The inner surface 21a forms a step configuration, and defines a hollow space. The hollow space has a lower sub-space 21b open to the lower surface of the first ceramic substrate 21 and an upper sub-space 21c narrower than the lower sub-space 21b and contiguous to a central portion of the lower sub-space 21b.

The first ceramic substrate 21 having the first multi-layer wiring 22a is made from laminated green sheet of aluminum oxide through a sintering technique.

In this instance, the upper surface and the lower surface of the first ceramic substrate 21 serve as a first surface and a second surface, respectively.

The multi-chip ceramic module further comprises a semiconductor chip 23, and an integrated circuit is, by way of example, fabricated on the semiconductor chip 23. The integrated circuit is connected through bonding wires 22d to the bonding pads 22b, and is electrically connected through the bonding wires 22d, the bonding pads 22b and the multi-layer wiring 22a to the vertical connections 22c. In this instance, the multi-layer wiring 22a, the bonding pads 22b, the vertical connections 22c and the bonding wires 22d as a whole constitute a first wiring means.

The multi-chip ceramic module further comprises a metallic radiator plate 24 bonded to the semiconductor chip 23 and a heat sink 25 bonded to the radiator plate 24. The metallic radiator plate 24 is further soldered to the upper surface of the first ceramic substrate 21. Although the metallic radiator plate 24 occupies a central area of the upper surface, no electric part is mounted on the upper surface of the first ceramic substrate 21, and the metallic radiator plate 24 can occupy the entire upper surface of the first ceramic substrate 21.

Figure 5:
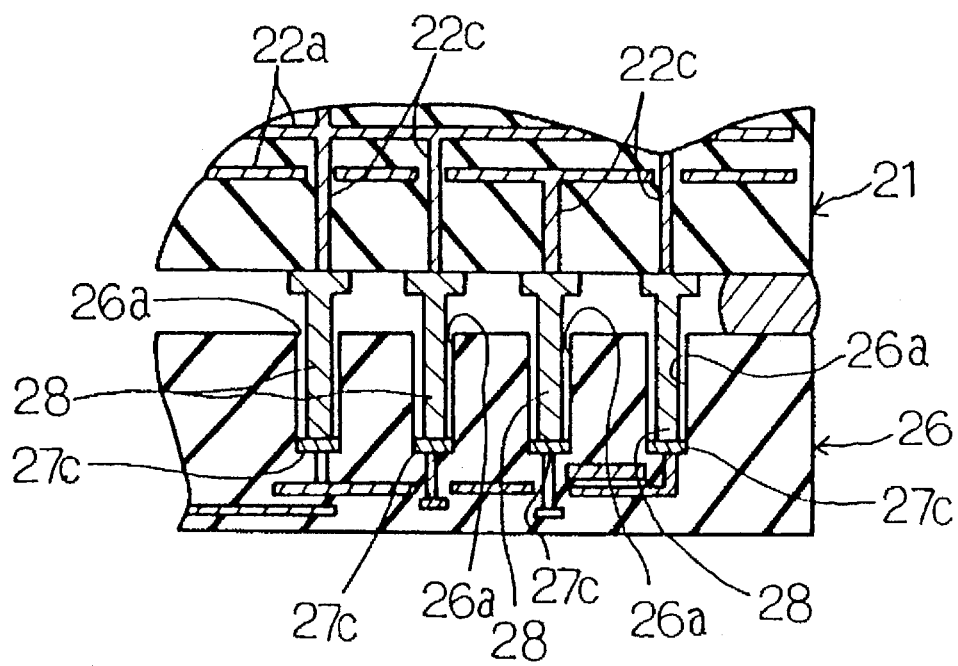
FIG. 5 is a cross sectional view showing interconnecting pins incorporated in the multi-chip ceramic module.

The multi-chip ceramic module further comprises a second ceramic substrate 26, and the second ceramic substrate 26 has an upper surface opposed to the lower surface of the first ceramic substrate 21 and a lower surface. As will be seen in FIG. 5, a plurality of narrow holes or recesses 26a are formed in the peripheral portion of the second ceramic substrate 26, which are open to the upper surface. The upper surface and the lower surface of the second ceramic substrate 26 serve as a third surface and a fourth surface, respectively.

Figure 6:
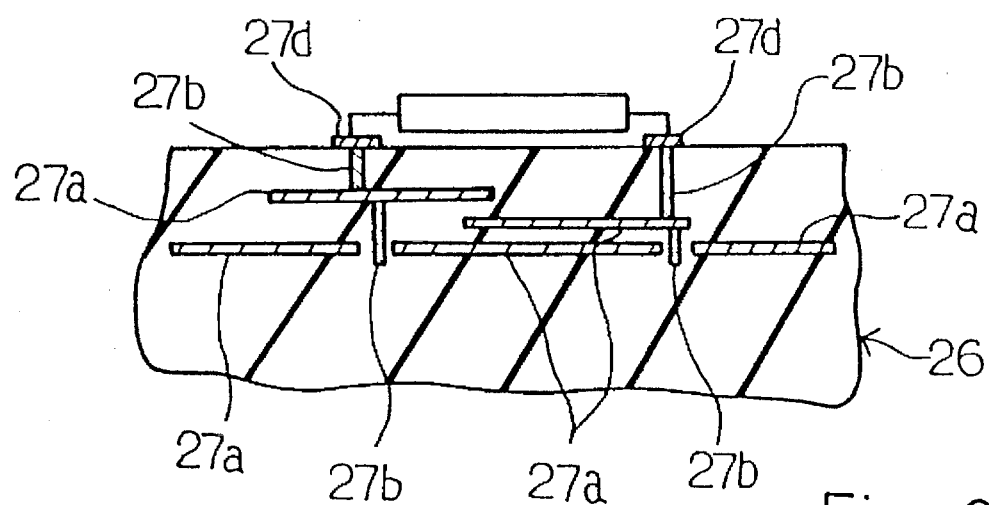
FIG. 6 is a cross sectional view showing an electric part bonded to contact pads.

Turning back to FIG. 4, the multi-chip ceramic module further comprises a second multi-layer wiring 27a formed in the second ceramic substrate 26, vertical connections 27b connected to the second multi-layer wiring 27a, first contact pads 27c formed on the bottom surfaces defining the narrow holes or recesses 26a (see FIG. 5) and second contact pads 27d formed on the upper surface of the second ceramic substrate 26 (see FIG. 6). The second multi-layer wiring 27a and the vertical connections 27b are electrically connected to the first contact pads 27c and the second contact pads 27d. The second multi-layer wiring 27a, the vertical connections 27b and the first and second contact pads 27c and 27d as a whole constitute a second wiring means.

Figure 7:
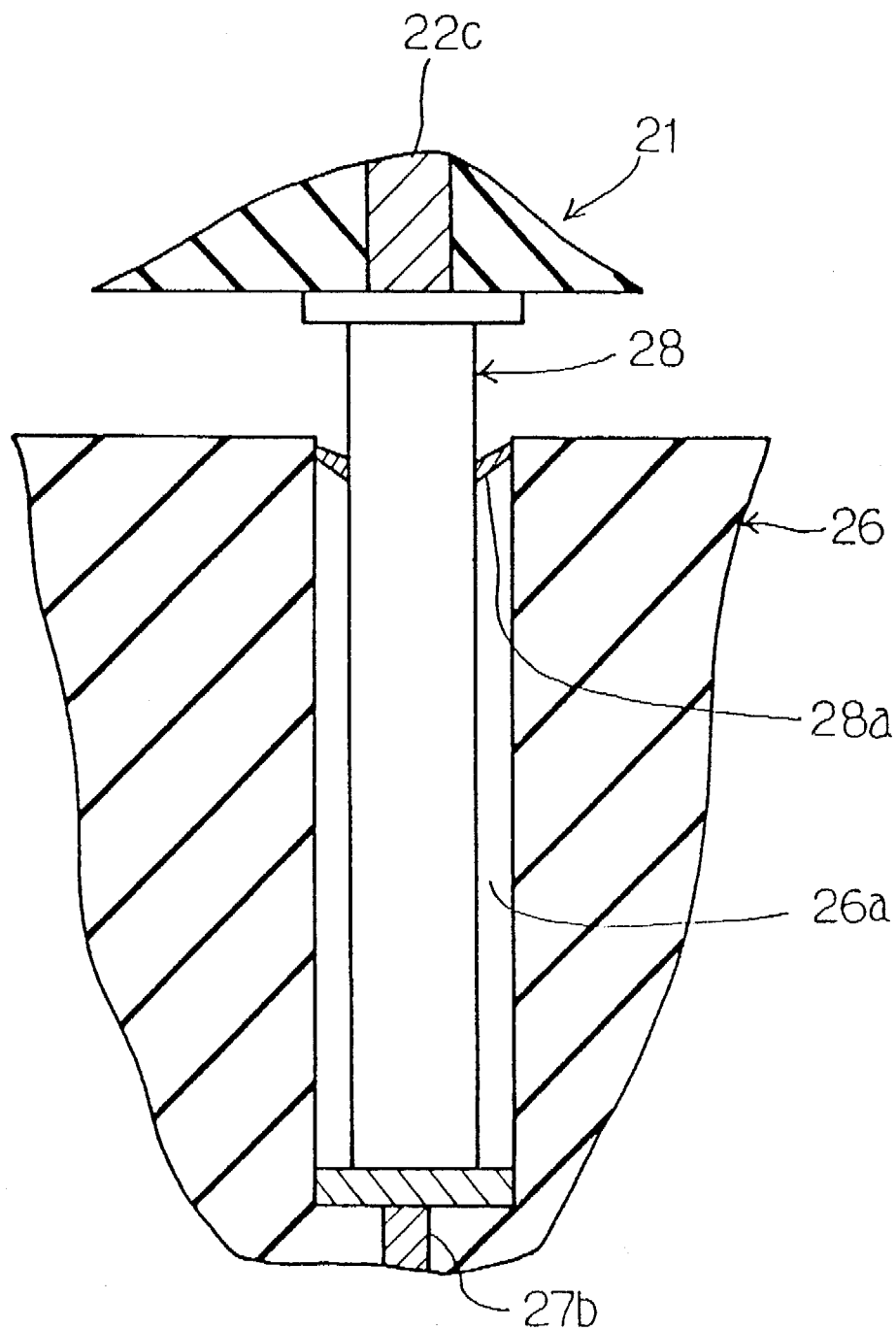
FIG. 7 is a cross sectional view showing a stopper provided for an interconnecting pin.

The multi-chip ceramic module further comprises a plurality of interconnecting pins 28 soldered to the vertical connections 22c, and the interconnecting pins 28 are held in contact with the contact pads 27c in the narrow holes or receives 26a. The interconnecting pin 28 has a stopper 28a like a guard of a sword (see FIG. 7), and the stopper 28a is engaged with the inner wall defining the narrow hole or recess 26a. The depth of the narrow holes or recesses 26a is dependent on the length of the connecting pins 28, and the connecting pins 28 are adjusted to a suitable length. In this instance, the interconnecting pin 28 is 3.8 millimeters in length, and the stopper 28a is provided at 2.8 millimeters from the leading end of the pin 28. Therefore, the narrow recess 26a is deeper than 2.8 millimeters, and allows the stopper to stick therein.

The connecting pins 28 and the contact pads 27c establish the reliable electrical connections between the first multi-layer wiring 22a and the second multi-layer wiring 27a, and therefore any disconnection is avoided.

The multi-chip ceramic module further comprises a plurality of electric parts 29a, 29b, 29c and 29d mounted on the upper surface of the second ceramic substrate 26 and a plurality of bumps 30 formed on the lower surface of the second ceramic substrate 26. The input-and-output pins of the other electric parts 29a to 29d are connected to the contact pads 27d, and the bumps 30 are connected to the portions of the second multi-layer wiring 27a exposed to the lower surface of the second ceramic substrate 26 (as shown in FIG. 4). The bumps 30 are well known to a person skilled in the art, and are replaceable with input-and-output pins.

Most of the lower surface of the second ceramic substrate 26 is available for the bumps 30, and the multi-chip ceramic module according to the present invention is suitable for a large number of input and output signals for an interface with external devices.

The first ceramic substrate 21 is soldered to the second ceramic substrate 26, and a piece of sealing solder 31 is provided along the periphery of the substrates 21 and 26. The sealing solder piece 31 seals the electric parts 23, 29a to 29d in the internal hollow space. Ag-paste is used for the electric part 23, and solder is used for the electric parts 29a and 29d. The sealing solder is melted at relatively low temperature, and allows the manufacturer to repair the multi-chip ceramic module. The sealing solder takes up internal stress due to the difference in thermal expansion, and prevents the ceramic substrates 21 and 26 from cracks.

The multi-chip ceramic module according to the present invention is fabricated as follows. First, wiring sub-patterns are printed on green sheets of aluminum oxide, and are laminated. The laminations are sintered, and the first ceramic substrate 21 and the second ceramic substrate 26. The wiring sub-patterns and the number of laminated green sheets can be changed depending upon the circuit arrangement of the multi-chip ceramic module, and electric properties such as inductance, capacitance and resistance can be arbitrarily adjusted.

The assembling work on the first ceramic substrate 21 is carried out in parallel with the assembling work on the second ceramic substrate 26, and the time consumed by the assembling work is reduced.

The metallic radiator plate 24 is soldered to the first ceramic substrate 21, and the interconnecting pins 28 are soldered to the contact pads 27c. The semiconductor chip 23 is bonded to the metallic radiator plate 24, and the electrodes on the semiconductor chip 23 are connected to the bonding pads 22b by a wire bonding technique.

On the other hand, the first and second contact pads 27c and 27d are provided in the narrow holes 26a and on the upper surface of the second ceramic substrate 26. The other electric parts 29a to 29d are connected to the second contact pads 27d, and the sealing solder 31 is provided on the periphery of the second ceramic substrate 26.

The interconnecting pins 28 are inserted into the narrow holes 26a, and establish the electrical connections between the first multi-layer wiring 22a and the second multi-layer wiring 27a. The sealing solder 31 is heated, and the first ceramic substrate 21 is soldered to the second ceramic substrate 26. The bumps 30 are formed on the lower surface of the second ceramic substrate 26. Finally, the heat sink is bonded to the metallic radiator plate 24.

Figure 8:
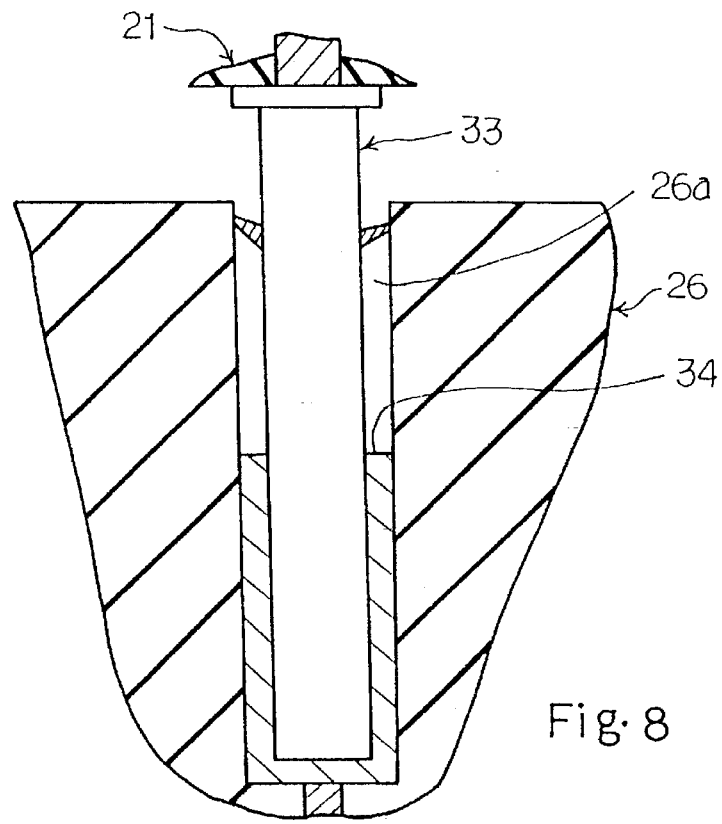
FIG. 8 is a cross sectional view showing a modification of a first contact pad.

An interconnecting pin 33 may be held in contact with the entire surface of a conductive member 34 embedded into the narrow hole 26a as shown in FIG. 8. The interconnecting pin 33 may not have the stopper so as to be held in contact with the entire surface of the conductive member extending over the depth of the narrow hole 26a.

Figure 9:
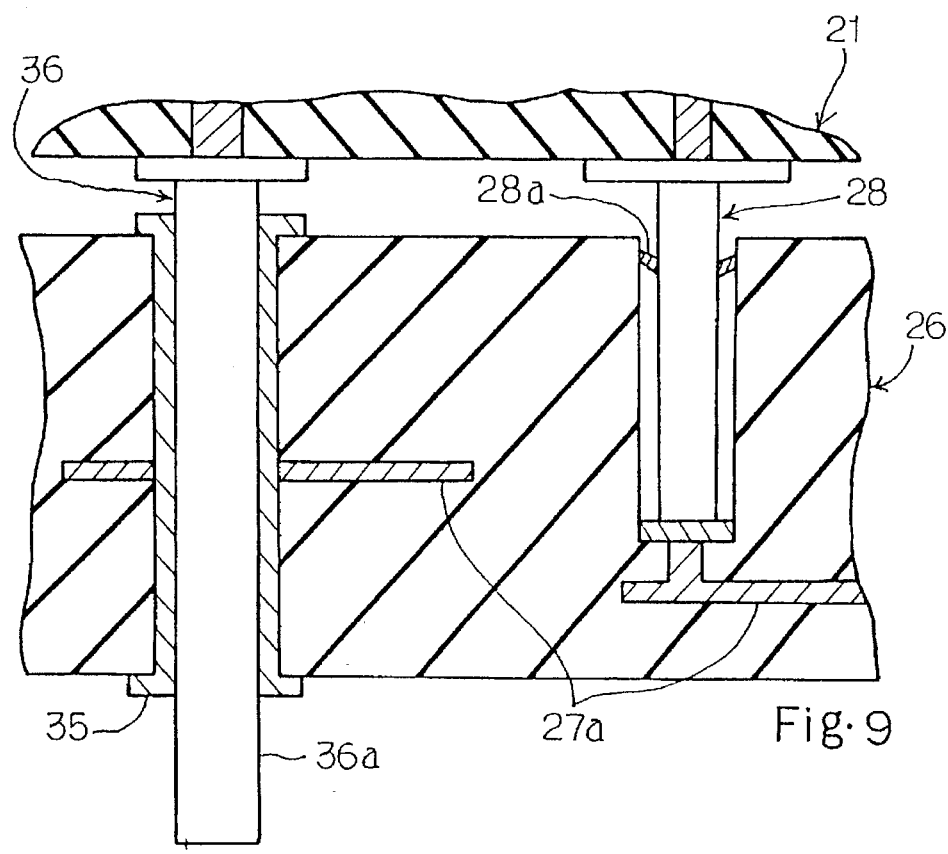
FIG. 9 is a cross sectional view showing a modification of the interconnection pin and the first contact pad.

A conductive member 35 may provide a through-hole for an interconnecting pin 36 (see FIG. 9), and the leading end portion 36a of the interconnecting pin 36 serves as an input/output pin.

As will be appreciated from the foregoing description, the multi-chip ceramic module according to the present invention ensures that a disconnection is avoided between the first multi-layer wiring 22a and the second multi-layer wiring 27a by virtue of the interconnecting pins 28. Of course, the time for the assembling work is reduced, and the large number of bumps and increase in heat radiation capability are achieved.

Second Embodiment

Figure 10:
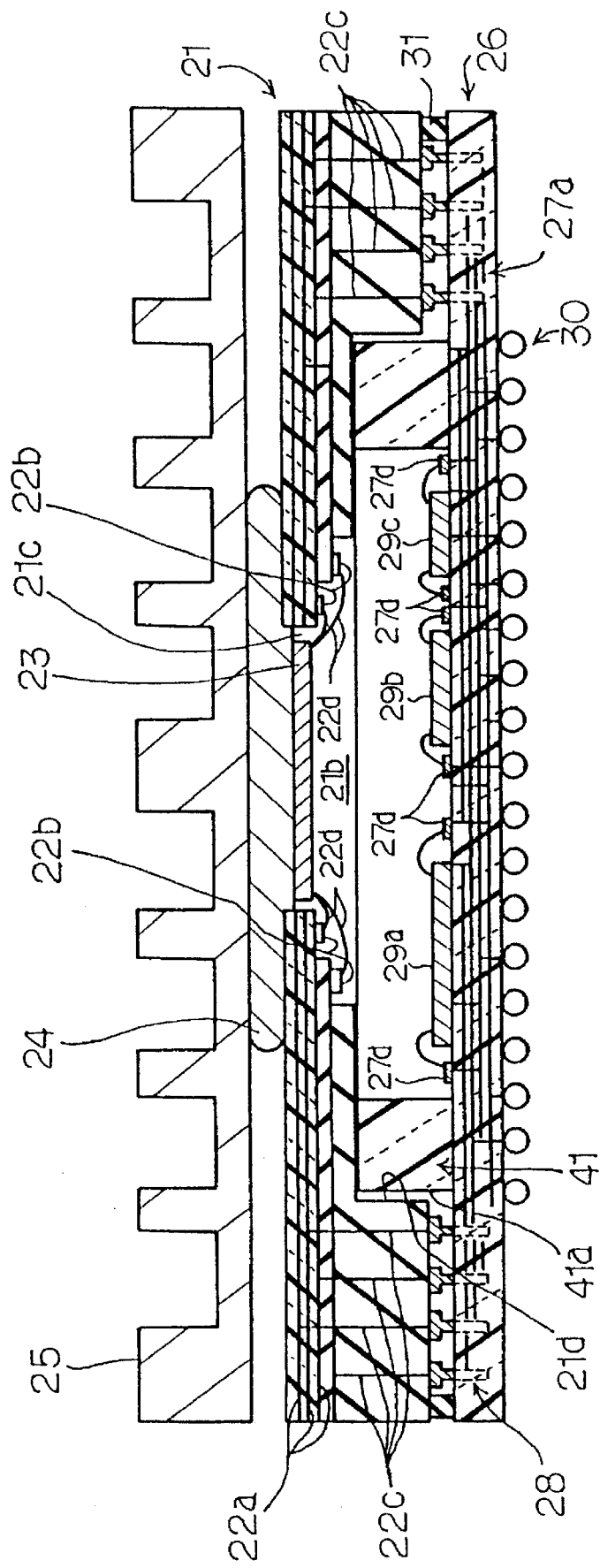
FIG. 10 is a cross sectional view showing the structure of another multi-chip ceramic module according to the present invention.

FIG. 10 illustrates another multi-chip ceramic module embodying the present invention. The multi-chip ceramic module implementing the second embodiment is similar to the first embodiment except for a ceramic guard frame 41. The other members and parts are similar to those of the first embodiment, and, for this reason, are labeled with the same references as those of the first embodiment without detailed description.

The guard frame 41 surrounds the electric parts 29a to 29c, and prevent them from undesirable destruction during the assembling work. The ceramic guard frame 41 is soldered to the upper surface of the second ceramic substrate 26, and has an outer configuration corresponding to the inner configuration of the first ceramic substrate 21 so as to serve as a jig member in the assembling work. Namely, the first ceramic substrate 21 is guided by the ceramic guard frame 41, and the interconnecting pins 28 are inserted into the narrow holes formed in the second ceramic substrate 26.

In this instance, the ceramic guard frame surrounds the electric parts 29a to 29c, the frame may be shaped into an L-letter configuration or a channel configuration.

Although particular embodiments of the present invention have been shown and described, it will be obvious to those skilled in the art that various changes and modifications may be made without departing from the spirit and scope of the present invention. For example, more than one semiconductor chip may be accommodated in the upper sub-space or upper sub-spaces formed in the first ceramic substrate 21, and only one electric part may be mounted on the upper surface of the second ceramic substrate 26.

Moreover, the interconnecting pins may be soldered to the second multi-layer wiring so as to be inserted into narrow holes formed in the first ceramic substrate.

The first and second substrates may be formed of other ceramic such as aluminum nitride, and another insulating material may be used for the substrates.

What is claimed is:

1. A multi-chip module comprising:

a first insulating substrate having a first surface, a second surface reverse to said first surface and an inner surface forming a hollow space open to said second surface, said hollow space having a first hollow sub-space open to said second surface and a second hollow sub-space narrower than said first hollow sub-space and contiguous to a central area of said first hollow sub-space;

a second insulating substrate having a third surface and a fourth surface reverse to said third surface, said third surface being connected to said second surface so as to close said hollow space therebetween;

a first wiring means formed at said first insulating substrate and having portions exposed to said second surface and portions exposed at said hollow space;

a second wiring means formed at said second insulating substrate and having portions exposed to said third surface and portions exposed to said fourth surface;

some of said portions of said first and second wiring means including contact pads;

at least one first electric part accommodated in said second hollow sub-space and electrically connected to said portions of said first wiring means exposed at said hollow space;

a plurality of input-and-output means provided on said fourth surface and connected to said portions of said second wiring means exposed to said fourth surface;

a plurality of conductive connecting means connected between said portions of said first wiring means exposed to said second surface and said portions of said second wiring means exposed to said third surface, said conductive connecting means including a plurality of interconnecting pins soldered to one of said first wiring means having portions exposed to said second surface and said second wiring means having portions exposed to one of said second surface and said third surface and respectively held in contact with respective contact pads of the other of said first wiring means and said second wiring means, one of said first insulating substrate and said second insulating substrate having a plurality of holes open to one of said third surface and said second surface, said respective contact pads being mounted in respective ones of said plurality of holes, said plurality of interconnecting pins being respectively inserted into said plurality of holes so as to be held in contact with said contact pads mounted in said plurality of holes, respectively; and at least one second electric part mounted on said third surface and connected to said portions of said second wiring means exposed to said third surface.

2. The multi-chip module as set forth in claim 1, further comprising a heat-conductive radiator plate bonded to said at least one electric part and fixed to said first insulating substrate for retaining said at least one first electric part in said second hollow sub-space.

3. The multi-chip module as set forth in claim 2, further comprising a heat sink bonded to said heat-conductive radiator plate.

4. The multi-chip module as set forth in claim 1, in which a bottom surface and an inner wall define each of said plurality of holes, and one of said plurality of contact pads covers said bottom surface and at least a part of said inner wall.

5. The multi-chip module as set forth in claim 1, in which a through-hole is formed in said second insulating substrate, and one of said plurality of interconnecting pins projects through said through-hole so as to serve as a pin for an input or output signal.

6. The multi-chip module as set forth in claim 1, further comprising an insulating frame bonded to said third surface of said second insulating substrate so as to prevent said at least one second electric part from a damage during an assembling work.

7. The multi-chip module as set forth in claim 6, in which said insulating frame has an outer surface corresponding to at least a part of said inner surface of said first insulating substrate defining a part of said first hollow sub-space so as to guide said first insulating substrate during an assembling work on said first and second insulating substrates.

* * * * *

UNITED STATES PATENT AND TRADEMARK OFFICE
CERTIFICATE OF CORRECTION

PATENT NO. : 5,633,783
DATED : MAY 27, 1997
INVENTOR(S) : Takesi YAMAMOTO

It is certified that error appears in the above-identified patent and that said Letters Patent is hereby corrected as shown below:

On the Title page, item (73), delete "Fujitsu Limited, Kanagawa, Japan" and insert --Nec Corporation, Tokyo, Japan--

Signed and Sealed this

Thirteenth Day of January, 1998

Attest:

BRUCE LEHMAN

Attesting Officer

Commissioner of Patents and Trademarks